United States Patent
Liu et al.

(10) Patent No.: US 6,492,269 B1
(45) Date of Patent: Dec. 10, 2002

(54) METHODS FOR EDGE ALIGNMENT MARK PROTECTION DURING DAMASCENE ELECTROCHEMICAL PLATING OF COPPER

(75) Inventors: Chung-Shi Liu, Hsin-Chu (TW); Shau-Lin Shue, Hsinchu (TW); Chen-Hua Yu, Hsiu-Chu (TW); Ching-Hua Hsieh, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/755,570

(22) Filed: Jan. 8, 2001

(51) Int. Cl.[7] .......................... H01L 21/44; H01L 21/76; H01L 21/46
(52) U.S. Cl. ....................... 438/687; 438/401; 438/462; 438/678
(58) Field of Search ................................. 438/401, 633, 438/462, 692, 687, 680, 681, 671, 678; 257/283, 793

(56) References Cited

U.S. PATENT DOCUMENTS

| | | | |
|---|---|---|---|
| 4,632,724 A | 12/1986 | Chesebro et al. | 156/626 |
| 5,897,371 A | 4/1999 | Yeh et al. | 438/633 |
| 5,899,738 A | 5/1999 | Wu et al. | 438/618 |
| 5,933,758 A | 8/1999 | Jain | 438/687 |
| 6,049,137 A | 4/2000 | Jang et al. | 257/797 |
| 6,057,206 A | 5/2000 | Nguyen et al. | 438/401 |
| 6,121,111 A * | 9/2000 | Jang et al. | |
| 6,277,658 B1 * | 8/2001 | Jeng et al. | |

* cited by examiner

Primary Examiner—Ha Tran Nguyen
(74) Attorney, Agent, or Firm—George O. Saile; Stephen B. Ackerman

(57) ABSTRACT

This invention relates to a method of fabrication for metal wiring used in semiconductor integrated circuit devices, and more specifically, to a copper plating method, whereby the wafer edge alignment marks for subsequent processing steps are protected from being covered by copper deposition by two methods: the first method being that of forming alignment mark shields at the wafer's edge, thus preventing both barrier and copper seed layers from being deposited in those regions; the second method being that of forming small pad-like extrusions at the contact ring of the copper plating fixture, thus preventing copper plating at the contact points. In the first method, an alignment mark shield Is utilized to cover the alignment mark areas, near the edge of the wafer, with a mechanical shield. This shield protects the alignment mark regions from film deposition during the sputter deposition steps of barrier and copper seed layers. The alignment marks are left without a copper seed layer, hence preventing copper deposition in these regions during copper electroplating. In the second method, the alignment mark areas, near the edge of the wafer, are protected from copper electroplating deposition by use of small pad-like extrusions positioned at copper plating contact ring. The pad-like extrusion is part of the contact ring and prevents copper buildup and deposition on the alignment mark.

31 Claims, 4 Drawing Sheets

METHODS FOR EDGE ALIGNMENT MARK PROTECTION DURING DAMASCENE ELECTROCHEMICAL PLATING OF COPPER

BACKGROUND OF THE INVENTION (1) Field of the Invention

This invention relates to a method of fabrication for metal wiring used in semiconductor integrated circuit devices, and more specifically, to a copper plating method, whereby the wafer edge alignment marks for subsequent processing steps are protected from being covered by copper deposition by two methods: the first method being that of forming alignment mark shields at the wafer's edge, thus preventing both barrier and copper seed layers from being deposited in those regions; the second method being that of forming small pad-like extrusions at the contact ring of the copper plating fixture, thus preventing copper plating at the contact points.

(2) Description of Related Art

In this section a description of related Prior Art background patents follows.

U.S. Pat. No. 5,933,758 entitled "Method For Preventing Electroplating Of Copper On An Exposed Surface At The Edge Exclusion Of A Semiconductor Wafer" granted Aug. 3, 1999 to Jain describes a process for not plating Cu on the outside edge of a wafer. A layer is in situ covered with a copper seed layer. The layer is not formed in an edge exclusion region, thereby exposing a portion of the layer. This portion will natively oxidize in a room ambient to form a copper electroplating prevention barrier, whereby copper will not electroplate in the region.

U.S. Pat. No. 6,049,137 entitled "Readable Alignment Mark Structure Formed Using Enhanced Chemical Mechanical Polishing" granted Apr. 11, 2000 to Jang et al. describes a chemical mechanical polish (CMP) process for an alignment mark area. A structure of a readable alignment mark and method of manufacturing the readable alignment mark in an alignment mark area on a semiconductor substrate is disclosed. Alignment mark trenches are formed in the substrate. An insulating layer is formed over the alignment mark area. The insulating layer is chemical mechanical polished (CMP), thereby removing a first thickness of the insulating layer from the alignment mark area, leaving a residual insulating layer in the alignment mark trenches. Etches are used to remove the residual insulating layer, a silicon nitride layer, and a pad oxide layer in the alignment mark area, thereby exposing the alignment marks and making the alignment marks readable.

U.S. Pat. No. 4,632,724 entitled "Visibility Enhancement Of First Order Alignment Marks" granted Dec. 30, 1986 to Chesebro et al. teaches an alignment mark process that forms a "block mask" over the alignment mark areas. After a given mark is formed, it is tested for visual contrast. If the contrast is insufficient to provide adequate alignment, a block mask is formed on a "critical mask". The block mask exposes all of the alignment target areas and protects the product regions of the wafer, and the "critical mask" only exposes the mark to be enhanced. The mark is then etched for a time period which is a function of the measured visual contrast, to enhance the alignment marks.

U.S. Pat. No. 6,057,206 entitled "Mark Protection Scheme With No Masking" granted May 2, 2000 to Nguyen et al. teaches an alignment mark protection scheme that forms an alignment mark protection layer over the alignment mark. The method also includes forming a negative photoresist layer over the alignment mark protection layer and removing a portion of the negative photoresist layer, which does not overlie the alignment mark. Preferably, the removal of a portion of the negative photoresist includes selectively exposing a peripheral portion using an "edge-bead removal tool". Therefore, the scheme allows for the formation of an alignment mark protection structure without an extra masking step.

U.S. Pat. No. 5,897,371 entitled "Alignment Process Compatible With Chemical Mechanical Polishing" granted Apr. 27, 1999 to Yeh et al. describes an alignment mark process with chemical mechanical polish (CMP), that deposits metal over the alignment marks. The invention discloses a process that maintains a second (or "replica") set of alignment marks during existing processing steps used in manufacturing a semiconductor device or integrated circuit, including chemical mechanical polish (CMP) and other planarization methods. The method describes a new alignment mark that may be "printed" in a metal layer on the wafer. The new alignment mark is generally not subjected to planarization or to an "open frame" process.

U.S. Pat. No. 5,899,738 entitled "Method For Making Metal Plugs In Stacked Vias For Multilevel Interconnections and Contact Openings While Retaining The Alignment Marks Without Requiring Extra Masking Steps" granted May 4, 1999 to Wu et al. teaches an alignment mark process that removes metal from over alignment marks. The method discloses the formation of stacked metal plugs in via holes and contacts, while retaining alignment marks without using additional masking steps. The method involves the deposition of a barrier layer and a tungsten layer, which fill the via holes or contact openings in an insulating layer. The tungsten is then etched back, without over-etching, to the surface of the barrier layer to form tungsten plugs that are coplanar with the surface of the insulating layer. Concurrently, the tungsten is removed from the recessed alignment marks, which allows for the replication of the alignment marks in the next level of metal, thereby eliminating additional masking steps.

SUMMARY OF THE INVENTION

This invention relates to a method of fabrication for metal wiring used in semiconductor integrated circuit devices, and more specifically, to a copper plating method, whereby the wafer edge alignment marks for subsequent processing steps are protected from being covered by copper deposition by two methods: the first method being that of forming alignment mark shields at the wafer's edge, thus preventing both barrier and copper seed layers from being deposited in those regions; the second method being that of forming small pad-like extrusions at the contact ring of the copper plating fixture, thus preventing copper plating at the contact points. In the first method, an alignment mark shield is utilized to cover the alignment mark areas, near the edge of the wafer, with a mechanical shield. This shield protects the alignment mark regions from film deposition during the sputter deposition steps of barrier and copper seed layers. The alignment marks are left without a copper seed layer, hence preventing copper deposition in these regions during copper electroplating. In the second method, the alignment mark areas, near the edge of the wafer, are protected from copper electroplating deposition by use of small pad-like extrusions positioned at copper plating contact ring. The pad-like extrusion is part of the contact ring and prevents copper buildup and deposition on the alignment mark.

In the first method, that is the use of an alignment mark shield, the key elements follow. As a background, one of the problems the present invention addresses is the problem of a recessed profile at the alignment mark area before copper damascene processing which leads to a copper and barrier layer remaining after the chemical mechanical polishing (CMP) of copper. In addition, during the electrochemical plating of copper higher currents occur at the cathode contact at the wafer's edge, which leads to a steep convex copper profile at the wafer's edge and residual copper remains after the chemical mechanical polishing (CMP) of copper. However, by using an alignment mark shield at copper seed and barrier sputter deposition steps, the electrochemical plating of copper (ECP-Cu) will not occur on the underlying dielectric layer. Hence a clean and transparent area at alignment mark can be achieved at post chemical mechanical polishing (CMP) of copper.

In the second method, the alignment mark areas, near the edge of the wafer, are protected from copper electroplating deposition by use of small pad-like extrusions positioned at copper plating contact ring. The key elements follow. The pad-like extrusion is part of the contact ring and prevents copper buildup and deposition on the alignment mark. As a background, similar to the first method, one of the problems the present invention addresses is that during the process of electrochemical plating of copper, higher currents occur at the cathode contact at the wafer's edge, which lead to a steep convex copper profile at the wafer's edge and residual copper remains after the chemical mechanical polishing (CMP) of copper, covering the alignment marks at the wafer's edge. However, following the following process sequence protects the alignment marks: a) damascene trench formation, b) copper barrier and seed layer deposition, c) electrochemical plating of copper (ECP-Cu) utilizing a small pad extrusion at the contact ring to avoid Cu plating on alignment marks, d) chemical mechanical polishing (CMP) of excess copper forming copper interconnects and contact vias.

This invention has been summarized above and described with reference to the preferred embodiments. Some processing details have been omitted and are understood by those skilled in the art. More details of this invention are stated in the "DESCRIPTION OF THE PREFERRED EMBODIMENTS" section.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

This invention relates to a method of fabrication for metal wiring used in semiconductor integrated circuit devices, and more specifically, to a copper plating method, whereby the wafer edge alignment marks for subsequent processing steps are protected from being covered by copper deposition by two methods: the first method being that of forming alignment mark shields at the wafer's edge, thus preventing both barrier and copper seed layers from being deposited in those regions; the second method being that of forming small pad-like extrusions at the contact ring of the copper plating fixture, thus preventing copper plating at the contact points. In the first method, an alignment mark shield is utilized to cover the alignment mark areas, near the edge of the wafer, with a mechanical shield. This shield protects the alignment mark regions from film deposition during the sputter deposition steps of barrier and copper seed layers. The alignment marks are left without a copper seed layer, hence preventing copper deposition in these regions during copper electroplating. In the second method, the alignment mark areas, near the edge of the wafer, are protected from copper electroplating deposition by use of small pad-like extrusions positioned at copper plating contact ring. The pad-like extrusion is part of the contact ring and prevents copper buildup and deposition on the alignment mark.

Figure 1A:
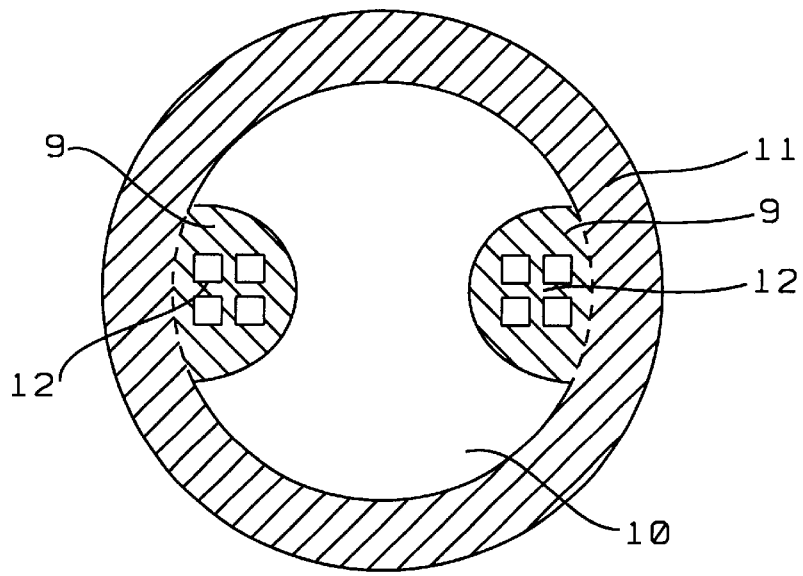
FIGS. 1A–1C, in sketches that are not to scale, illustrate and exaggerate the key features of the first copper plating method, whereby the wafer edge alignment marks for subsequent processing steps are protected from being covered by copper deposition, forming alignment mark shields at the wafer's edge, thus preventing both barrier and copper seed layers from being deposited in those regions.
Figure 1B:
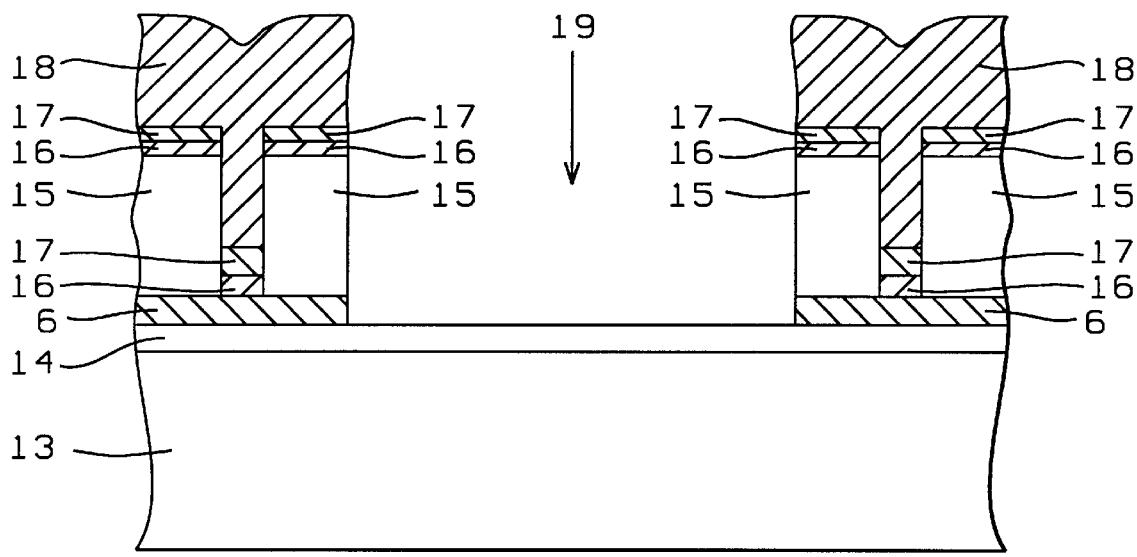
Figure 1C:
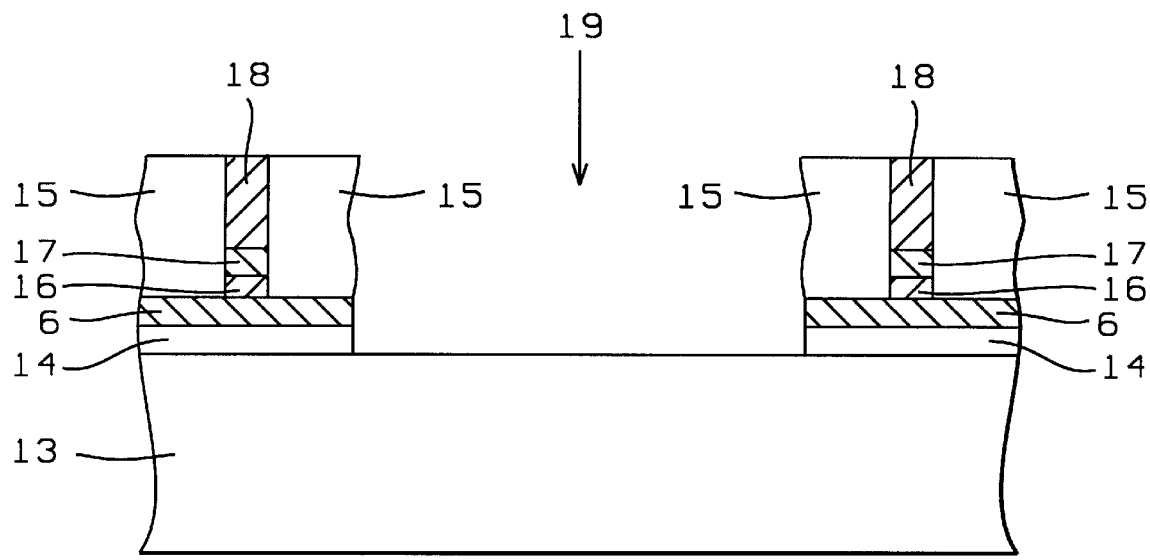

Referring to FIGS. 1A–1C, in sketches that are not to scale, illustrate and exaggerate the key features of the first copper plating method, whereby the wafer edge alignment marks for subsequent processing steps are protected from being covered by copper deposition, forming alignment mark shields at the wafer's edge, thus preventing both barrier and copper seed layers from being deposited in those regions.

Referring to FIG. 1A, in the first method, that is the use of an alignment mark shield, the key elements follow. The single crystal silicon wafer substrate (10) is underneath the sputter blockout mask 11. The sputter blockout mask 11 is positioned over the silicon wafer substrate 10, such that, the extended tabs (9) on the mask 11 cover and protect the alignment marks 12.

Referring to FIG. 1B, in cross-sectional representation, illustrates (not to scale), the following key process steps of present invention, first method. Provided is a substrate 13, of Si, Ge or GaAs, or an IC module, all having semiconductor devices and prior alignment marks (not shown in figs.), upon which is an insulating layer 14. Over the silicon substrate 13 and over the insulating layer 14 is formed a patterned metal conducting layer 6. Over the patterned metal conducting layer 6 and insulating layer 14 is deposited a thick layer of dielectric 15. Formed in the thick layer of dielectric 15 is an open trench region 19. In a dual damascene process, not shown in the Figs., a trench/via opening is formed and this trench/via is also applicable to the present invention. The pertinent alignment marks are formed in the trench region 19 (arrow). The blockout mask 11 referred to in FIG. 1A is placed over the substrate 13 and trench 19 shown in FIG. 1B, in close proximity to the substrate 13 to block the subsequent sputter process. Hence, the subsequent process steps follow. A barrier layer 16 and copper seed layer 17 are sputter deposited over the patterned metal conducting layer 6, over the thick layer of dielectric 15, while the trench 19 is protected from the sputter deposition by the blockout mask 11 with the extended tabs 12, shown in FIG. 1A. As shown in FIG. 1B, the barrier 16, TaN, and copper seed layer 17 are sputter deposited, physical vapor deposition (PVD), and fill all openings on substrate 13, except those trench regions 19 (arrow) in which there are alignment marks. The next process step is the "plate-up", ECP-Cu electrochemical plating of copper onto and over the copper seed layer 17. The ECP-Cu electrochemical plating of copper, is shown in FIG. 1B as the thick copper layer 18. The plating process uses CuSO$_4$ solution as the electrolyte, in a temperature range of between 20 to 60° C., and yields a Cu plating thickness from about 3,000 to 15,000 Angstroms.

Referring to FIG. 1C, in cross-sectional representation illustrates (not to scale), the final key processing steps of the first method of the present invention. The excess copper of thick copper layer, excess top copper seed layer and excess top barrier layer are polished back by chemical mechanical polish (CMP), leaving a planarized surface with the copper layer 18 in FIG. 1C, being even with the top surface of the thick layer of dielectric 15. The alignment mark region in the trench 19 (arrow) remains clean and free of metal.

As described above, the present invention prevents the problem of a recessed profile at the alignment mark area before copper damascene processing, which leads to a copper and barrier layer remaining after the chemical mechanical polishing (CMP) of copper. In addition, during the electrochemical plating of copper higher currents occur at the cathode contact at the wafer's edge, which leads to a steep convex copper profile at the wafer's edge and residual copper remains after the chemical mechanical polishing (CMP) of copper. However, by using an alignment mark shield at copper seed and barrier sputter deposition steps, the electrochemical plating of copper (ECP-Cu) will not occur on the underlying dielectric layer. Hence a clean and transparent area at alignment mark can be achieved at post chemical mechanical polishing (CMP) of copper.

In the second method, the alignment mark areas, near the edge of the wafer, are protected from copper electroplating deposition by use of small pad-like extrusions positioned at copper plating contact ring. The key elements follow. The pad-like extrusion is part of the contact ring and prevents copper buildup and deposition on the alignment mark. As a background, similar to the first method, one of the problems the present invention addresses is that during the process of electrochemical plating of copper, higher currents occur at the cathode contact at the wafer's edge, which lead to a steep convex copper profile at the wafer's edge and residual copper remains after the chemical mechanical polishing (CMP) of copper, covering the alignment marks at the wafer's edge. However, following the following process sequence protects the alignment marks: a) damascene trench formation, b) copper barrier and seed layer deposition, c) electrochemical plating of copper (ECP-Cu) utilizing a small pad extrusion at the contact ring to avoid Cu plating on alignment marks, d) chemical mechanical polishing (CMP) of excess copper forming copper interconnects and contact vias.

Figure 2A:
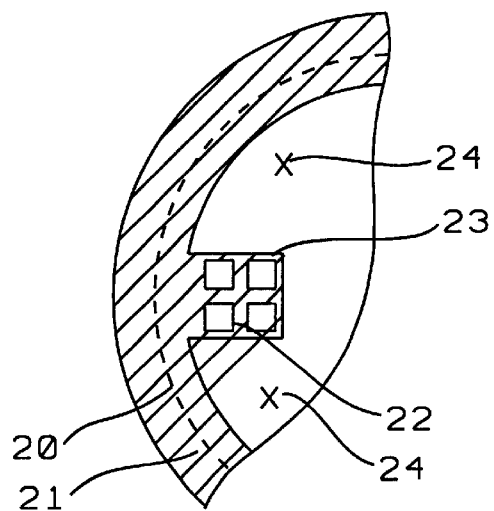
FIGS. 2A–2C, in sketches that are not to scale, illustrate and exaggerate the key features of the second copper plating method, whereby the wafer edge alignment marks for subsequent processing steps are protected from being covered by copper deposition, by forming small pad-like extrusions at the contact ring of the copper plating fixture, thus preventing copper plating at the contact points.
Figure 2B:
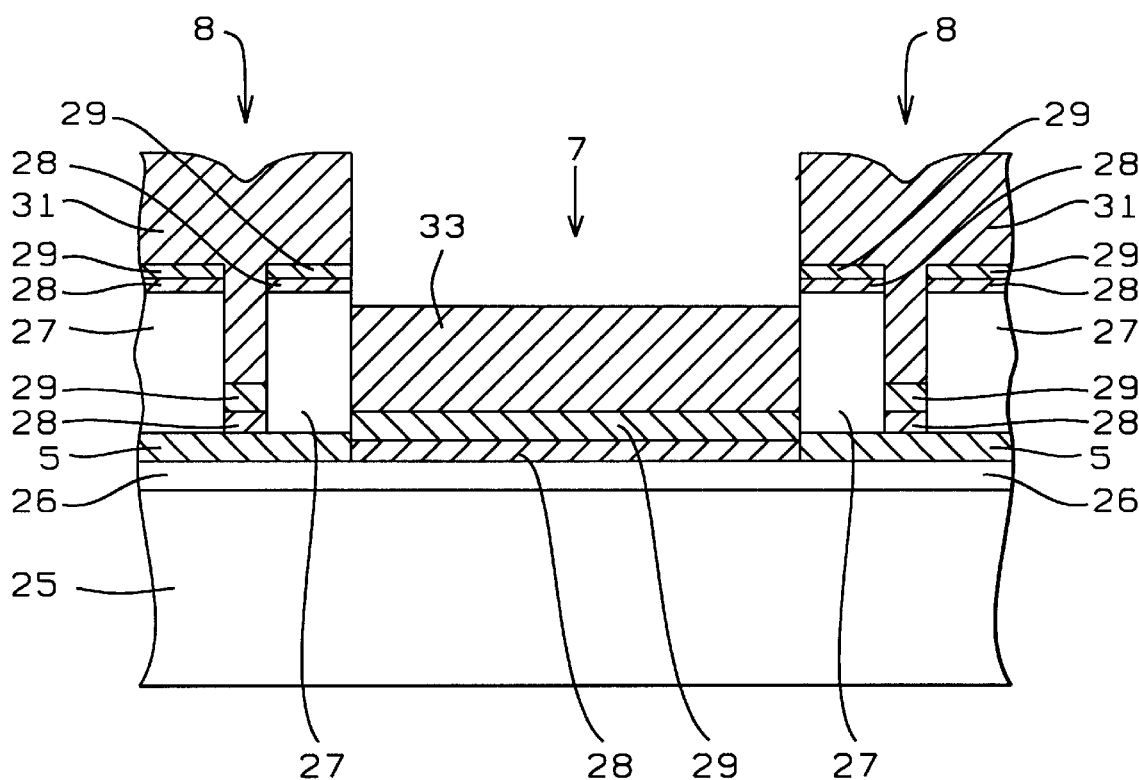
Figure 2C:
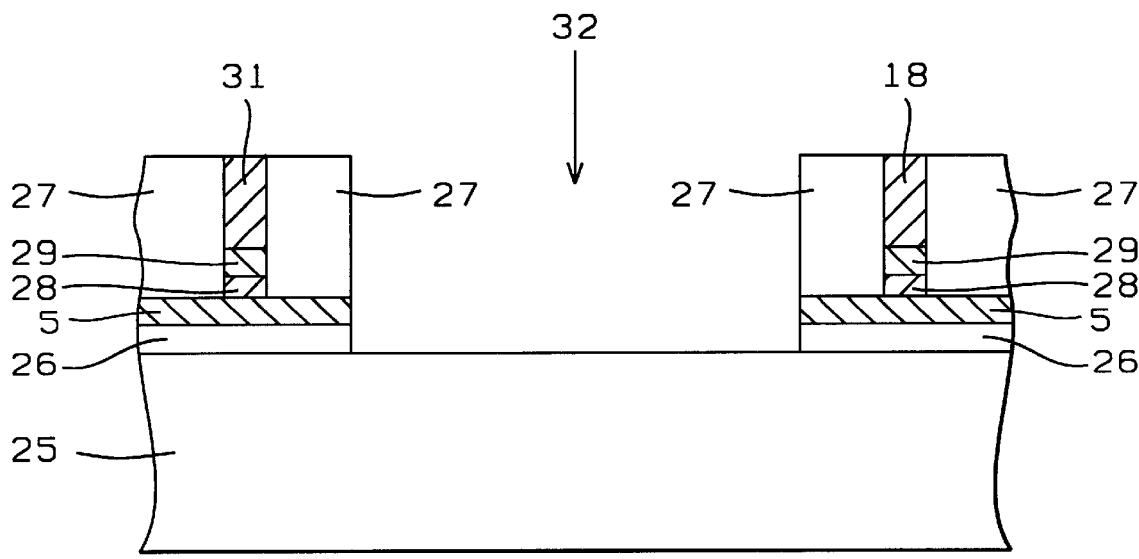

Referring to FIGS. 2A–2C, in sketches that are not to scale, illustrate and exaggerate the key features of the second copper plating method, whereby the wafer edge alignment marks for subsequent processing steps are protected from being covered by copper deposition, by forming small pad-like extrusions at the contact ring of the copper plating fixture, thus preventing copper plating at the contact points.

Referring to FIG. 2A, in the second method, the alignment mark areas 22, near the edge of the wafer (20) dotted line, are protected from copper electroplating deposition by use of small pad-like extrusions 23 positioned at copper plating contact ring 21. The key elements follow. As shown in FIG. 2A, the single crystal silicon wafer substrate (20), dotted line, is underneath the copper plating contact ring 21. The copper plating contact points 24 for contact ring pins are also illustrated in FIG. 2B. The alignment marks 22 tend to be about 3 mm×3 mm square area regions forming an array of four marks, with the centers about 5 mm from the wafer edge. The sketch in FIG. 2A is deliberately not draw to scale to highlight and exaggerate the key features of the pin-like extrusions 23 that are part of copper plating contact ring 21.

Referring to FIG. 2B, in cross-sectional representation, illustrates (not to scale), the following key process steps of present invention, second method. Provided is a substrate 25, of Si, Ge or GaAs ,or an IC module, all having semiconductor devices and prior alignment marks (not shown in figs.), upon which is an insulating layer 26. Over the silicon substrate 25 and over the insulating layer 26 is formed a patterned metal conducting layer 5. Over the patterned metal conducting layer 5 and insulating layer 26 is deposited a thick layer of dielectric 27. Formed in the thick layer of dielectric 27 are open trench regions 8 (arrows), to be subsequently filled. In a dual damascene process, not shown in the Figs., a trench/via opening is formed and this trench/via is also applicable to the present invention. The pertinent alignment marks are formed in the trench 7 (arrow). A barrier layer 28 and copper seed layer 29 are sputter deposited over the patterned metal conducting layer 5, over the exposed insulating layer 26 and over the thick layer of dielectric 27. More specifically, the barrier 28, TaN, and copper seed layer 29 are sputter deposited, physical vapor deposition (PVD), and fill all openings on substrate 25. Next, the special electroplating copper ring and pin-like extrusion are placed over and in contact with the wafer substrate, such that the pin-like extrusions cover the alignment marks. The pin-like extrusions 30 in FIG. 2B cover the alignment mark region, which is located in the trench region 7 (arrow). Note in FIG. 2B, the pin-like extrusions are shown covering the barrier 28 and copper seed layer 29, thus preventing the electroplating of copper in this region. The next process step is the "plate-up", ECP-Cu electrochemical plating of copper onto and over the copper seed layer 29, and the copper is plated or deposited only in the regions where the copper seed layer is exposed. The ECP-Cu electrochemical plating of copper, is shown in FIG. 2B as the thick copper layer 31, in regions 8 (arrow). The plating process uses CuSO$_4$ solution as the electrolyte, in a temperature range of between 20 to 60° C., and yields a Cu plating thickness from about 3,000 to 15,000 Angstroms. The alignment mark region 7 (arrow), where alignment marks are protected, does not have thick copper deposited. This method can only be used on a "planarized" alignment mark. It ensures that the pad extension region has thinner copper (33) deposited, which avoids the problem of some copper remaining after copper chemical mechanical polishing, Cu-CMP.

Referring to FIG. 2C, in cross-sectional representation illustrates (not to scale), the final key processing steps of the second method of the present invention. The plating ring with the pin-like extrusions is removed from the substrate wafer. The excess copper of thick copper layer, excess top copper seed layer and excess top barrier layer are polished back by chemical mechanical polish (CMP), leaving a planarized surface with the copper layer 31 in FIG. 2C. The alignment mark region 32 (arrow) remains clean, transparent and free of metal, after copper chemical mechanical polish, Cu-CMP.

Figure 3:
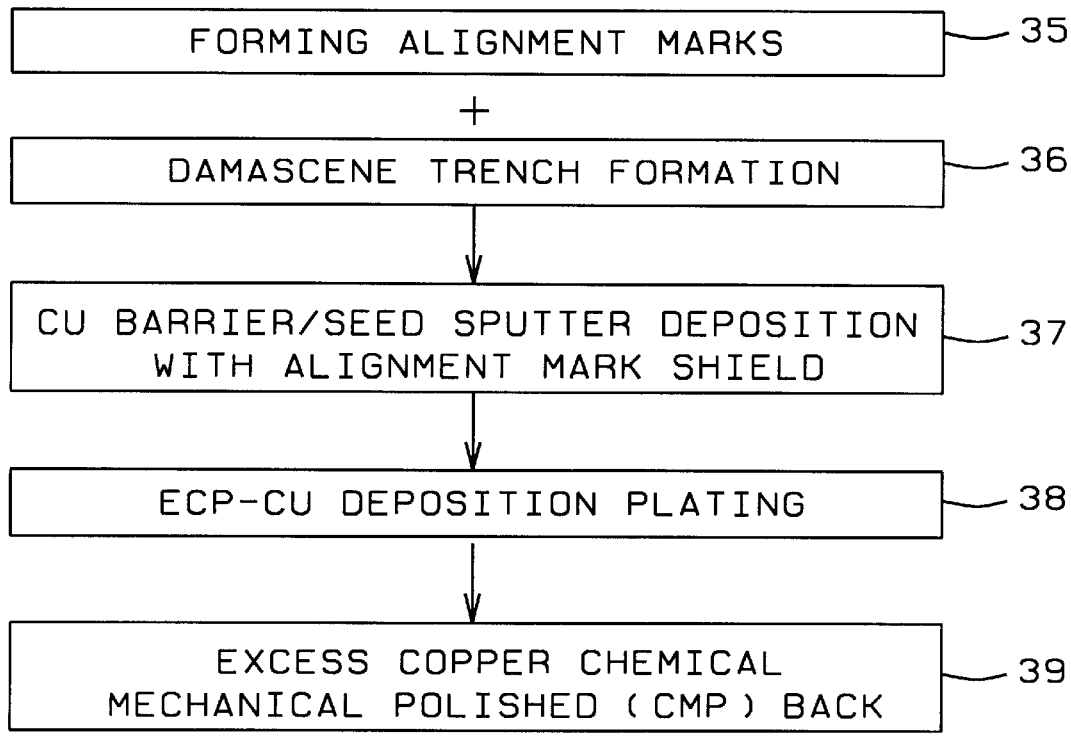
FIG. 3, which is a block flow diagram illustrating the key process steps of the first method of the present invention.

Referring to FIG. 3, which is a block flow diagram illustrating the key process steps of the first method of the present invention. Firstly, the alignment marks 35 are formed in the kerf region, along with the damascene trench 36. An alignment mark shield or blockout mask with tabs protects the alignment marks from the sputter deposition 37 of barrier and copper seed layer. Copper plating depositing 38 follows the barrier and seed layer deposition. Copper plating occurs only in regions where there is the copper seed layer, not in alignment mark regions. Final steps are chemical mechanical polishing (CMP) 39 off of excess copper.

Figure 4:
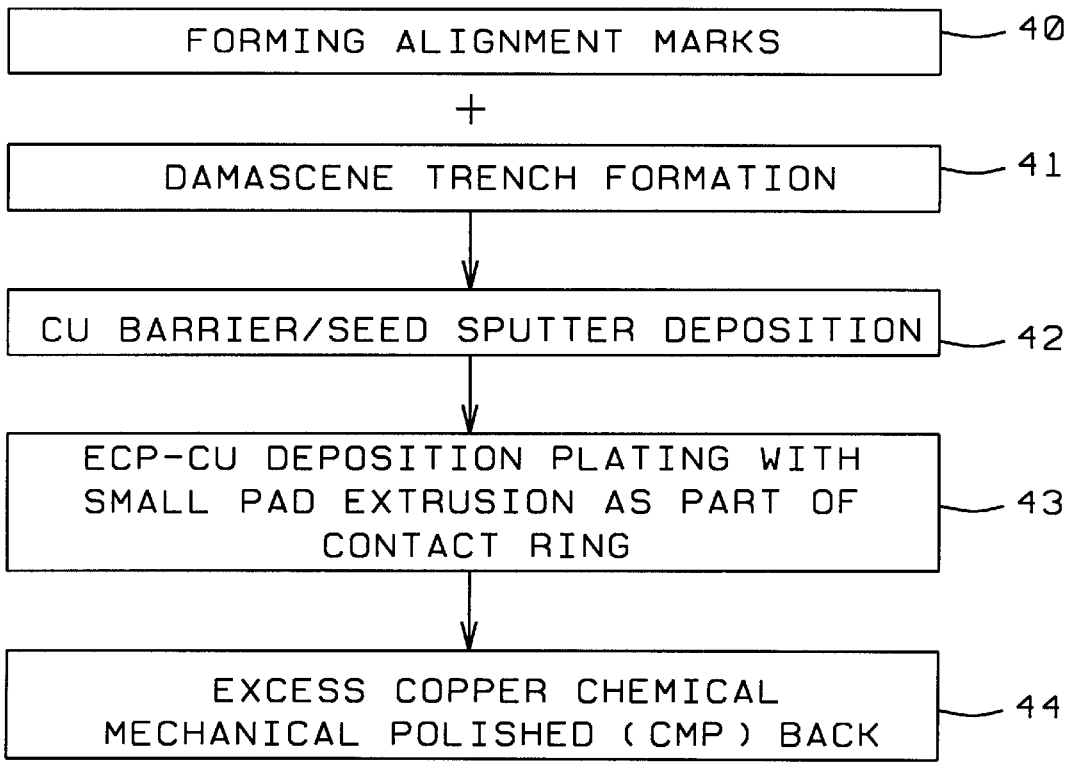
FIG. 4, which is a block flow diagram illustrating the key process steps of the second method of the present invention.

Referring to FIG. 4, which is a block flow diagram illustrating the key process steps of the second method of the present invention. Firstly, the alignment marks 40 are formed in the kerf region, along with the damascene trench 41. The sputter deposition 42 of barrier and copper seed layer is performed. Next, the plating of copper 43 is performed with a small pad-like extrusion covering the alignment marks, as part of the contact ring. The copper plating depositing occurs on regions where the copper seed layer exposed. Next, the final steps are chemical mechanical polishing (CMP) 44 off of the excess copper.

The methods of the present invention for edge alignment mark protection during damascene electrochemical plating of copper apply to damascene and dual damascene for manufacturing copper interconnects and contact vias in applications with MOSFET and CMOS semiconductor devices. There are alternate ways of forming the conducting wiring in a damascene and dual damascene build, wherein the top surface is planarized by removing the excess copper and other excess materials, by selection from one or a combination of following methods: chemical mechanical polish (CMP), milling, ion milling, and/or etching. In addition, the first and second methods of the present invention can be combined, using both together: sputter blockout mask or shield, and the use of the pad-like extrusion for a plating block. This can be performed, to make doubly certain, that one obtains clear alignment marks. Wide applications of the methods of the present invention include, but are limited to, substrates consisting of: single crystal Si, Ge or GaAs, or an IC module, all having semiconductor devices and prior alignment marks. Some alignment mark specifications are: size 400 microns, depth 1,200 Angstroms into the silicon substrate.

The inlaid copper wiring formed by the dual damascene process is forms contact vias and interconnect to the underlying, patterned conducting layer and the patterned conducting layer is selected from the group consisting conductively doped polysilicon.

More processing details for the present invention follow, to demonstrate diligence and provide a more detailed description of the specifications for the barrier layer. The barrier layer consists of TaN, which is the bottom or first barrier metal layer. The metal barrier material can also be selected from the group consisting of TaN type materials, deposited by sputtering, physical vapor deposition (PVD), in a temperature range of between 20 to 300° C., and in a thickness range between 100 to 500 Angstroms. Nominal process conditions are: tantalum nitride reactively sputtered with argon and nitrogen gases, TaN thickness of approximately 300 Angstroms at about 150° C., in DC Magnetron sputtering system using a power setting of approximately 1500 W.

More processing details for the present invention follow, to demonstrate diligence and provide a more detailed description of the specifications for the copper seed layer. The copper seed layer consists of Cu type materials, deposited by sputtering, physical vapor deposition (PVD), in a temperature range of between 20 to 300° C., and in a thickness range between 500 to 2,000 Angstroms. Nominal process conditions are: Cu sputtered with argon gas, Cu thickness of about 1,500 Angstroms at temperature of about 25° C., using a DC Magnetron sputtering system at a power setting of about 1500 W.

More processing details for the present invention follow, to demonstrate diligence and provide a more detailed description of the specifications for the thick layer of dielectric. The thick layer of dielectric is selected from is selected from the group consisting of: silicon oxide, silicon dioxide, phosphosilicate glass (PSG), fluoro-silicate glass (FSG), deposited by low pressure chemical vapor deposition (LPCVD), a pressure of about 5 Torr, with gases $SiH_4$ and $O_2$, and film thickness from 4,000 to 10,000 Angstroms.

While the invention has been particularly shown and described with reference to the preferred embodiments thereof, it will be understood by those skilled in the art that various changes in form and details may be made without departing from the spirit and scope of the invention.

What is claimed is:

1. A method for fabricating conductive copper interconnects and contact vias comprising:
    (a) providing a substrate having semiconductor devices with prior alignment marks therein, upon which is an insulating layer;
    (b) forming a patterned conducting layer over the insulating layer;
    (c) depositing a dielectric layer over the patterned conducting layer;
    (d) forming openings in the layer of dielectric aligned to said patterned conducting layer, and forming alignment marks in kerf areas of said substrate;
    (e) placing and positioning a blackout mask over the substrate, protecting the alignment marks;
    (f) depositing by sputtering with the blockout mask in place, a barrier layer and a copper seed layer, over the patterned conducting layer and dielectric layer;
    (g) placing an electroplating copper ring with pin-like extrusions in contact with the substrate, such that the pin-like extrusions cover the alignment marks in kerf areas;
    (h) depositing using the electroplating copper ring with pin-like extrusions, a layer of copper by ECP-Cu electrochemical plating of copper onto and over exposed portions of the copper seed layer;
    (i) removing excess materials by planarization to form inlaid copper interconnects/contact vias, with the alignment marks in place for subsequent processing.

2. The method of claim 1, wherein the substrate is selected from the group consisting of: single crystal Si, Ge or GaAs, or IC module, all having semiconductor devices and prior alignment marks.

3. The method of claim 1, wherein the barrier material consists of TaN deposited by sputtering, physical vapor deposition (PVD), in a temperature range of between 20 to 300° C., and in a thickness range between 100 to 500 Angstroms.

4. The method of claim 1, wherein the copper seed layer material with consists Cu material deposited by sputtering, physical vapor deposition (PVD), in a temperature range of between 20 to 300° C., and in a thickness range between 500 to 2,000 Angstroms.

5. The method of claim 1, wherein the layer of copper consists of copper deposited by ECP-Cu electrochemical plating of copper upon the copper seed layer, in a temperature range of between 20 to 60° C., and in a thickness range between 3,000 to 15,000 Angstroms.

6. The method of claim 1, wherein conducting wiring can be formed by a dual damascene method, wherein the step of removing the excess materials is selected from the group consisting of planarization by: chemical mechanical polish (CMP), milling, ion milling, and/or etching.

7. The method of claim 1, wherein the blockout mask is placed and positioned over the substrate, in contact with the substrate, blocking the barrier and seed layer sputter deposition process over the alignment marks.

8. The method of claim 1, in which a electroplating copper ring with pin-like extrusions is positioned over and in contact with the substrate, such that pin-like extrusions cover the alignment marks in kerf areas of said substrate protecting the alignment marks, during a layer of copper deposition by ECP-Cu electrochemical plating of copper, while allowing the layer of copper to plate over the exposed portions of the copper seed layer.

9. The method of claim 1, wherein the layer of dielectric is selected from the group consisting of: silicon oxide, silicon dioxide, phosphosilicate glass (PSG), fluoro-silicate glass (FSG), deposited by low pressure chemical vapor deposition (LPCVD), a pressure of about 5 Torr, with gases $SiH_4$ and $O_2$, and film thickness from 4,000 to 10,000 Angstroms.

10. The method of claim 1, wherein the patterned conducting layer consists of conductively doped polysilicon.

11. The method of claim 1, wherein multilevel conducting structures are fabricated by repeating steps (c) through (i).

12. A method for fabricating conductive copper interconnects and contact vias for applications in MOSFET and CMOS semiconductor devices for trench/via fill applications, protecting alignment marks, comprising:
(a) providing a substrate having semiconductor devices with prior alignment marks therein, upon which is an insulating layer;
(b) forming a patterned conducting layer over the insulating layer;
(c) depositing a layer of dielectric over the patterned conducting layer;
(d) forming openings in the layer of dielectric aligned to said patterned conducting layer, and forming trenches used as alignment marks in kerf areas of said substrate:
(e) placing and positioning a blockout mask over the substrate and trenches, in contact with the substrate, and
(f) depositing by sputter deposition, physical vapor deposition (PVD), with said blockout mask in place, first a barrier layer and then a copper seed layer, over the patterned conducting layer, over the layer of dielectric, while the trenches are protected from the sputter deposition by the blockout mask, filling all openings on the substrate, except over the alignment marks;
(g) depositing a layer of copper by ECP-Cu electrochemical plating of copper onto and over the copper seed layer;
(h) removing excess materials in the copper layer, in the copper seed layer and in the barrier layer by planarization to form inlaid conductive copper interconnects and contact vias, with alignment marks in place for subsequent processing.

13. The method of claim 12, wherein the substrate is selected from the group consisting of: single crystal Si, Ge or GaAs, or an IC module, all having semiconductor devices and prior alignment marks.

14. The method of claim 12, wherein the barrier material consists of TaN deposited by sputtering, physical vapor deposition (PVD), in a temperature range of between 20 to 300° C., and in a thickness range between 100 to 500 Angstroms.

15. The method of claim 12, wherein the copper seed layer material is selected from the group consisting of Cu material deposited by sputtering, physical vapor deposition (PVD), in a temperature range of between 20 to 300° C., and in a thickness range between 500 to 2,000 Angstroms.

16. The method of claim 12, wherein the layer of copper consists of copper deposited by ECP-Cu electrochemical plating of copper upon with copper seed layer, in a temperature range of between 20 to 60° C., and in a thickness range between 3,000 to 15,000 Angstroms.

17. The method of claim 12, wherein conducting wiring can be formed by a dual damascene method, wherein the step of removing the excess materials is selected from the group consisting of planarization by: chemical mechanical polish (CMP), milling, ion milling, and/or etching.

18. The method of claim 12, wherein the blockout mask is placed and positioned over the substrate and trenches, in contact with the substrate, blocking the barrier and seed layer sputter deposition process over the alignment marks.

19. The method of claim 12, wherein the layer of dielectric is selected from the group consisting of: silicon oxide, silicon dioxide, phosphosilicate glass (PSG), fluoro-silicate glass (FSG), deposited by low pressure chemical vapor deposition (LPCVD), a pressure of about 5 Torr, with gases $SiH_4$ and $O_2$, and film thickness from 4,000 to 10,000 Angstroms.

20. The method of claim 12, wherein the patterned conducting layer consists of conductively doped polysilicon.

21. The method of claim 12, wherein multilevel conducting structures are fabricated by repeating steps (c) through (h).

22. A method for fabricating conductive copper interconnects and contact vias for applications in MOSFET and CMOS semiconductor devices for trench/via fill applications, protecting alignment marks, comprising:
(a) providing a substrate having semiconductor devices with prior alignment marks therein, upon which is an insulating layer;
(b) forming a patterned conducting layer over the insulating layer;
(c) depositing a layer of dielectric over the patterned conducting layer;
(d) forming openings in the layer of dielectric aligned to said patterned conducting layer, said layer of dielectric and forming trenches, used as alignment marks in kerf areas of said substrate;
(e) depositing by sputter deposition, physical vapor deposition (PVD), first a barrier layer and then a copper seed layer, over the patterned conducting layer, over the layer of dielectric, filling all openings on the substrate;
(f) placing and positioning a electroplating copper ring with pin-like extrusions over and in contact with the substrate, such that the pin-like extrusions cover the alignment marks in kerf areas of said substrate;
(g) depositing with the electroplating copper ring with pin-like extrusions protecting the alignment marks, a layer of copper by ECP-Cu electrochemical plating of copper onto and over exposed portions of the copper seed layer;
(h) removing excess materials in the copper layer, in the copper seed layer and in the barrier layer by planarization to form inlaid conductive copper interconnects and contact vias, with alignment marks in place for subsequent processing.

23. The method of claim 22, wherein the substrate is selected from the group consisting of: single crystal Si, Ge or GaAs, or an IC module, all having semiconductor devices and prior alignment marks.

24. The method of claim 22, wherein the barrier material consists of TaN deposited by sputtering, physical vapor deposition (PVD), in a temperature range of between 20 to 300° C., and in a thickness range between 100 to 500 Angstroms.

25. The method of claim 22, wherein the copper seed layer material is selected from the group consisting of Cu material deposited by sputtering, physical vapor deposition (PVD), in a temperature range of between 20 to 300° C., and in a thickness range between 500 to 2,000 Angstroms.

26. The method of claim 22, wherein the layer of copper consists of copper deposited by ECP-Cu electrochemical plating of copper upon with copper seed layer, in a temperature range of between 20 to 60° C., and in a thickness range between 3,000 to 15,000 Angstroms.

27. The method of claim 22, wherein conducting wiring can be formed by a dual damascene method, wherein the step of removing the excess materials is selected from the group consisting of planarization by: chemical mechanical polish (CMP), milling, ion milling, and/or etching.

28. The method of claim 22, in which a electroplating copper ring with pin-like extrusions is positioned over and in contact with the substrate, such that pin-like extrusions cover the alignment marks in kerf areas of said substrate protecting the alignment marks, during a layer of copper deposition by ECP-Cu electrochemical plating of copper, while allowing the layer of copper to plate over the exposed portions of the copper seed layer.

29. The method of claim 22, wherein the layer of dielectric is selected from the group consisting of: silicon oxide, silicon dioxide, phosphosilicate glass (PSG), fluoro-silicate glass (FSG), deposited by low pressure chemical vapor deposition (LPCVD), a pressure of about 5 Torr, with gases $SiH_4$ and $O_2$, and film thickness from 4,000 to 10,000 Angstroms.

30. The method of claim 22, wherein the patterned conducting layer consists of conductively doped polysilicon.

31. The method of claim 22, wherein multilevel conducting structures are fabricated by relating steps (C) through (h).

* * * * *